(12) United States Patent
Phan

(10) Patent No.: US 10,048,875 B2
(45) Date of Patent: Aug. 14, 2018

(54) SYSTEM AND METHOD FOR MANAGING ACCESS REQUESTS TO A MEMORY STORAGE SUBSYSTEM

(71) Applicant: Western Digital Technologies, Inc., Irvine, CA (US)

(72) Inventor: Lan D. Phan, Trabuco Canyon, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/294,063

(22) Filed: Oct. 14, 2016

(65) Prior Publication Data

US 2017/0031607 A1    Feb. 2, 2017

Related U.S. Application Data

(60) Continuation of application No. 14/885,018, filed on Oct. 16, 2015, now Pat. No. 9,477,413, which is a
(Continued)

(51) Int. Cl.
  *G06F 3/06* (2006.01)
  *G06F 12/02* (2006.01)
  *G11C 7/10* (2006.01)

(52) U.S. Cl.
  CPC .......... *G06F 3/0611* (2013.01); *G06F 3/0653* (2013.01); *G06F 3/0655* (2013.01);
(Continued)

(58) Field of Classification Search
  CPC .. G06F 3/0611; G06F 12/0253; G06F 3/0688; G06F 3/0655; G06F 3/0679;
(Continued)

(56) References Cited

U.S. PATENT DOCUMENTS 4,758,947 A    7/1988 Levendel et al.
4,819,154 A    4/1989 Stiffler et al.
(Continued)

FOREIGN PATENT DOCUMENTS

EP    0 710 906 A1    5/1996

OTHER PUBLICATIONS

Taratorin, Alexander M. and Klaas B. Klassen, Observation of Recording Pole Instability in Perpendicular Recording, IEEE Transaction on Magnetics, vol. 42, No. 10, Oct. 2006, pp. 2267-2269.
(Continued)

*Primary Examiner* — Christopher D Birkhimer
(74) *Attorney, Agent, or Firm* — Patterson & Sheridan, LLP; Puja S. Detjen

(57) ABSTRACT

Embodiments of this disclosure relate to improving solid-state non-volatile memory management. Embodiments improve the management of solid-state non-volatile memory by providing an execution manager responsible for controlling the timing of providing a request to a memory unit for execution. In embodiments, the execution manager traverses a list of received requests for memory access and dispatches commands for execution. In embodiments, if a request is directed to memory units which have reached a threshold for outstanding requests, the request may be skipped so that other requests can be dispatched for memory units which have not yet reached the threshold.

14 Claims, 8 Drawing Sheets

Related U.S. Application Data division of application No. 13/166,985, filed on Jun. 23, 2011, now Pat. No. 9,164,886.

(60) Provisional application No. 61/385,132, filed on Sep. 21, 2010.

(52) U.S. Cl.
CPC .......... G06F 3/0659 (2013.01); G06F 3/0679 (2013.01); G06F 3/0688 (2013.01); G06F 12/0246 (2013.01); G06F 12/0253 (2013.01); G06F 2212/7201 (2013.01); G06F 2212/7205 (2013.01); G06F 2212/7211 (2013.01); G11C 7/1006 (2013.01)

(58) Field of Classification Search
CPC .. G06F 3/0659; G06F 3/0653; G06F 12/0246; G06F 2212/7211; G06F 2212/7205; G06F 2212/7201; G11C 7/1006
See application file for complete search history.

(56) References Cited

U.S. PATENT DOCUMENTS

| | | | |
|---|---|---|---|
| 5,093,780 A | 3/1992 | Sunahara | |
| 5,101,410 A | 3/1992 | Nimura et al. | |
| 5,123,094 A | 6/1992 | MacDougall | |
| 5,191,649 A | 3/1993 | Cadambi et al. | |
| 5,450,565 A | 9/1995 | Nadir et al. | |
| 5,535,417 A | 7/1996 | Baji et al. | |
| 5,548,728 A | 8/1996 | Danknick | |
| 5,634,099 A | 5/1997 | Andrews et al. | |
| 5,835,779 A | 11/1998 | Chang et al. | |
| 5,860,092 A | 1/1999 | Breid et al. | |
| 5,870,572 A | 2/1999 | Garcia | |
| 5,895,487 A | 4/1999 | Boyd et al. | |
| 5,937,205 A * | 8/1999 | Mattson | G06F 13/1642 710/41 |
| 5,937,428 A | 8/1999 | Jantz | |
| 6,049,847 A | 4/2000 | Vogt et al. | |
| 6,055,603 A * | 4/2000 | Ofer | G06F 12/0866 710/54 |
| 6,085,200 A | 7/2000 | Hill et al. | |
| 6,088,740 A | 7/2000 | Ghaffari | |
| 6,148,369 A * | 11/2000 | Ofer | G06F 3/0608 710/39 |
| 6,205,521 B1 | 3/2001 | Schumann | |
| 6,209,053 B1 | 3/2001 | Kurts | |
| 6,209,059 B1 * | 3/2001 | Ofer | G06F 3/0607 711/114 |
| 6,223,205 B1 * | 4/2001 | Harchol-Balter | G06F 9/505 718/102 |
| 6,223,271 B1 | 4/2001 | Cepulis | |
| 6,260,109 B1 * | 7/2001 | Ofer | G06F 3/0608 710/39 |
| 6,338,122 B1 | 1/2002 | Baumgartner et al. | |
| 6,381,682 B2 | 4/2002 | Noel et al. | |
| 6,393,536 B1 | 5/2002 | Hughes et al. | |
| 6,430,639 B1 | 8/2002 | Meyer et al. | |
| 6,430,654 B1 | 8/2002 | Mehrotra et al. | |
| 6,475,062 B1 | 11/2002 | Kubota et al. | |
| 6,574,708 B2 | 6/2003 | Hayter et al. | |
| 6,591,340 B2 | 7/2003 | Chopra et al. | |
| 6,622,211 B2 | 9/2003 | Henry et al. | |
| 6,654,860 B1 | 11/2003 | Strongin et al. | |
| 6,678,801 B1 | 1/2004 | Greim et al. | |
| 6,751,583 B1 | 6/2004 | Clarke et al. | |
| 6,757,781 B2 | 6/2004 | Williams et al. | |
| 6,760,820 B2 | 7/2004 | Henson et al. | |
| 6,792,473 B2 | 9/2004 | Harnois | |
| 6,851,062 B2 | 2/2005 | Hartmann | |
| 6,856,556 B1 | 2/2005 | Hajeck | |
| 6,859,886 B1 | 2/2005 | Johnson | |
| 6,862,151 B2 | 3/2005 | Hoskins et al. | |
| 6,865,651 B2 | 3/2005 | Woodward | |
| 6,871,343 B1 | 3/2005 | Yoshikawa | |
| 6,924,811 B1 | 8/2005 | Minkin | |
| 6,957,237 B1 * | 10/2005 | Traversat | G06F 12/0269 |
| 6,969,989 B1 | 11/2005 | Mei | |
| 7,031,928 B1 * | 4/2006 | Cochran | G06F 3/061 705/1.1 |
| 7,082,494 B1 | 7/2006 | Thelin et al. | |
| 7,114,041 B2 | 9/2006 | Hammitt et al. | |
| 7,126,857 B2 | 10/2006 | Hajeck | |
| 7,174,467 B1 | 2/2007 | Helms et al. | |
| 7,188,219 B2 | 3/2007 | Jeddeloh | |
| 7,188,229 B2 | 3/2007 | Lowe | |
| 7,222,217 B2 | 5/2007 | Gray | |
| 7,240,182 B2 | 7/2007 | Day et al. | |
| 7,248,586 B1 | 7/2007 | Hughes et al. | |
| 7,302,510 B2 * | 11/2007 | Fredrickson | G06F 13/362 370/447 |
| 7,310,699 B2 | 12/2007 | Sinclair | |
| 7,313,641 B2 | 12/2007 | Koch et al. | |
| 7,315,917 B2 | 1/2008 | Bennett et al. | |
| 7,340,580 B2 | 3/2008 | Kinoshita | |
| 7,363,396 B2 | 4/2008 | Liu et al. | |
| 7,363,421 B2 | 4/2008 | Di Sena et al. | |
| 7,366,826 B2 | 4/2008 | Gorobets et al. | |
| 7,403,542 B1 | 7/2008 | Thompson | |
| 7,406,547 B2 | 7/2008 | Haines et al. | |
| 7,424,587 B2 | 9/2008 | Caulkins et al. | |
| 7,430,136 B2 | 9/2008 | Merry, Jr. et al. | |
| 7,441,054 B2 | 10/2008 | Wu et al. | |
| 7,441,067 B2 | 10/2008 | Gorobets et al. | |
| 7,447,807 B1 | 11/2008 | Merry et al. | |
| 7,457,903 B2 | 11/2008 | Purdham et al. | |
| 7,464,216 B2 * | 12/2008 | Gorobets | G06F 12/0253 711/103 |
| 7,478,130 B2 * | 1/2009 | Aoki | G06F 9/542 709/206 |
| 7,487,286 B2 | 2/2009 | Nagano et al. | |
| 7,493,452 B2 | 2/2009 | Eichenberger et al. | |
| 7,502,256 B2 | 3/2009 | Merry, Jr. et al. | |
| 7,509,441 B1 | 3/2009 | Merry et al. | |
| 7,535,109 B2 | 5/2009 | Robinson | |
| 7,539,816 B2 | 5/2009 | Ohsaki | |
| 7,574,554 B2 * | 8/2009 | Tanaka | G06F 11/1068 711/103 |
| 7,577,795 B2 | 8/2009 | Hutton et al. | |
| 7,582,868 B2 | 9/2009 | Jiang et al. | |
| 7,594,044 B2 * | 9/2009 | Brewer | G06F 3/0605 710/36 |
| 7,596,643 B2 | 9/2009 | Merry, Jr. et al. | |
| 7,620,661 B2 | 11/2009 | Mehaffy et al. | |
| 7,620,770 B2 | 11/2009 | Levi | |
| 7,653,778 B2 | 1/2010 | Merry, Jr. et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,693,991 B2 | 4/2010 | Greenlee | |
| 7,710,962 B2 * | 5/2010 | Kodama | H04L 45/16 370/390 |
| 7,733,712 B1 | 6/2010 | Walston et al. | |
| 7,761,669 B2 | 7/2010 | Allison | |
| 7,765,373 B1 | 7/2010 | Merry et al. | |
| 7,779,054 B1 * | 8/2010 | Printezis | G06F 12/0276 707/813 |
| 7,779,416 B2 | 8/2010 | Koga | |
| 7,831,783 B2 | 11/2010 | Pandit et al. | |
| 7,898,855 B2 | 3/2011 | Merry, Jr. et al. | |
| 7,912,991 B1 | 3/2011 | Merry et al. | |
| 7,936,603 B2 | 5/2011 | Merry, Jr. et al. | |
| 7,962,792 B2 | 6/2011 | Diggs et al. | |
| 8,078,918 B2 | 12/2011 | Diggs et al. | |
| 8,090,899 B1 | 1/2012 | Syu | |
| 8,095,851 B2 | 1/2012 | Diggs et al. | |
| 8,108,692 B1 | 1/2012 | Merry et al. | |
| 8,122,185 B2 | 2/2012 | Merry, Jr. et al. | |
| 8,127,048 B1 | 2/2012 | Merry et al. | |
| 8,135,903 B1 | 3/2012 | Kan | |
| 8,151,020 B2 | 4/2012 | Merry, Jr. et al. | |

(56) References Cited

U.S. PATENT DOCUMENTS

| | | | |
|---|---|---|---|
| 8,161,227 B1 | 4/2012 | Diggs et al. |
| 8,166,245 B2 | 4/2012 | Diggs et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,635,412 B1 | 1/2014 | Wilshire |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2001/0034809 A1 | 10/2001 | Ogawa |
| 2002/0029354 A1 | 2/2002 | Forehand et al. |
| 2002/0040413 A1 | 4/2002 | Okada et al. |
| 2002/0083111 A1 | 6/2002 | Row et al. |
| 2003/0126224 A1 | 7/2003 | Harnois |
| 2003/0212859 A1 | 11/2003 | Ellis |
| 2004/0028068 A1 | 2/2004 | Kizhepat |
| 2004/0039880 A1 | 2/2004 | Pentkovski et al. |
| 2004/0049612 A1 | 3/2004 | Boyd et al. |
| 2004/0148460 A1 | 7/2004 | Steinmetz |
| 2004/0193743 A1 | 9/2004 | Byers et al. |
| 2004/0202165 A1* | 10/2004 | Aoki ............... G06F 9/542 |
| | | 370/392 |
| 2005/0055496 A1 | 3/2005 | Nallapa |
| 2005/0193081 A1 | 9/2005 | Gruber et al. |
| 2005/0204187 A1 | 9/2005 | Lee et al. |
| 2006/0015490 A1 | 1/2006 | Denuit et al. |
| 2006/0143412 A1* | 6/2006 | Armangau ........ G06F 3/0611 |
| | | 711/162 |
| 2006/0143506 A1 | 6/2006 | Whitt |
| 2006/0155917 A1 | 7/2006 | Di Sena et al. |
| 2006/0161724 A1 | 7/2006 | Bennett et al. |
| 2006/0288184 A1 | 12/2006 | Riska |
| 2007/0016721 A1 | 1/2007 | Gay |
| 2007/0033332 A1 | 2/2007 | Sinclair et al. |
| 2007/0043900 A1 | 2/2007 | Yun |
| 2007/0073949 A1* | 3/2007 | Fredrickson ......... G06F 13/362 |
| | | 710/243 |
| 2007/0133531 A1* | 6/2007 | Kodama ............. H04L 45/16 |
| | | 370/390 |
| 2007/0186032 A1 | 8/2007 | Sinclair et al. |
| 2007/0186065 A1 | 8/2007 | Lee et al. |
| 2007/0198804 A1 | 8/2007 | Moyer |
| 2007/0255897 A1 | 11/2007 | McNutt |
| 2007/0260655 A1* | 11/2007 | Adams .............. G06F 9/542 |
| 2007/0263739 A1* | 11/2007 | Garrett ............... H04L 1/1845 |
| | | 375/260 |
| 2008/0082596 A1* | 4/2008 | Gorobets ........... G06F 12/0253 |
| 2008/0082736 A1 | 4/2008 | Chow et al. |
| 2008/0082775 A1* | 4/2008 | Gorobets ........... G06F 12/0246 |
| | | 711/170 |
| 2008/0091872 A1 | 4/2008 | Bennett et al. |
| 2008/0114926 A1 | 5/2008 | Levi |
| 2008/0126662 A1 | 5/2008 | Rajbharti |
| 2008/0126685 A1 | 5/2008 | Danilak |
| 2008/0126719 A1 | 5/2008 | Danilak |
| 2008/0126720 A1 | 5/2008 | Danilak |
| 2008/0126891 A1 | 5/2008 | Danilak |
| 2008/0155166 A1 | 6/2008 | James et al. |
| 2008/0168194 A1* | 7/2008 | Gregg ............... G06F 3/0611 |
| | | 710/52 |
| 2008/0235443 A1 | 9/2008 | Chow et al. |
| 2008/0244135 A1* | 10/2008 | Akesson ............ G06F 13/1626 |
| | | 710/241 |
| 2008/0263114 A1* | 10/2008 | Nath ................. G06F 17/30327 |
| 2008/0263305 A1 | 10/2008 | Shu et al. |
| 2008/0282024 A1 | 11/2008 | Biswas et al. |
| 2008/0288717 A1 | 11/2008 | Torabi |
| 2008/0307164 A1 | 12/2008 | Sinclair |
| 2009/0006689 A1 | 1/2009 | Lubbers |
| 2009/0012976 A1 | 1/2009 | Kang et al. |
| 2009/0017220 A1 | 1/2009 | Muller et al. |
| 2009/0049256 A1* | 2/2009 | Hughes ............. G06F 13/1626 |
| | | 711/158 |
| 2009/0049450 A1 | 2/2009 | Dunshea |
| 2009/0070502 A1 | 3/2009 | Noha et al. |
| 2009/0100182 A1 | 4/2009 | Chaudhry |
| 2009/0100307 A1* | 4/2009 | Lee .................. G06F 9/4403 |
| | | 714/746 |
| 2009/0116475 A1 | 5/2009 | Krzyzanowski et al. |
| 2009/0119460 A1 | 5/2009 | Lin et al. |
| 2009/0129163 A1 | 5/2009 | Danilak |
| 2009/0150599 A1 | 6/2009 | Bennett |
| 2009/0154026 A1 | 6/2009 | Jiang et al. |
| 2009/0172250 A1 | 7/2009 | Allen et al. |
| 2009/0172258 A1* | 7/2009 | Olbrich ............. G06F 13/1657 |
| | | 711/103 |
| 2009/0172260 A1* | 7/2009 | Olbrich ............. G06F 13/1657 |
| | | 711/103 |
| 2009/0177845 A1 | 7/2009 | Moyer et al. |
| 2009/0187798 A1* | 7/2009 | Kim ................. G11C 5/025 |
| | | 714/710 |
| 2009/0198924 A1 | 8/2009 | Shaeffer |
| 2009/0248917 A1 | 10/2009 | Kalos |
| 2009/0271562 A1 | 10/2009 | Sinclair |
| 2009/0310408 A1* | 12/2009 | Lee ................. G11C 11/5628 |
| | | 365/185.03 |
| 2009/0313501 A1 | 12/2009 | Hallivuori |
| 2010/0023672 A1 | 1/2010 | Gorobets et al. |
| 2010/0037009 A1 | 2/2010 | Yano et al. |
| 2010/0076944 A1 | 3/2010 | Kamat |
| 2010/0118041 A1 | 5/2010 | Chen et al. |
| 2010/0174849 A1 | 7/2010 | Walston et al. |
| 2010/0185806 A1 | 7/2010 | Prithi et al. |
| 2010/0250793 A1 | 9/2010 | Syu |
| 2010/0262760 A1 | 10/2010 | Swing et al. |
| 2011/0022778 A1 | 1/2011 | Schibilla et al. |
| 2011/0055455 A1 | 3/2011 | Post et al. |
| 2011/0055458 A1 | 3/2011 | Kuehne |
| 2011/0099323 A1 | 4/2011 | Syu |

(56) References Cited

U.S. PATENT DOCUMENTS

| | | |
|---|---|---|
| 2011/0191566 A1 | 8/2011 | Takamiya et al. |
| 2011/0231624 A1 | 9/2011 | Fukutomi et al. |
| 2011/0283049 A1 | 11/2011 | Kang et al. |
| 2012/0239851 A1 | 9/2012 | Calvert et al. |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0024595 A1 | 1/2013 | Subramaniyan et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |

OTHER PUBLICATIONS

Webpage for "ANANDTECH," http://www.anandtech.com, retrieved on Jun. 17, 2011 (9 pages).

Hu et al., "Write Amplification Analysis in Flash-Based Solid State Drives", SYSTOR'09, Haifa, 2009, Zurich Research Laboratory, copyright 2009 IBM Corporation, downloaded on May 12, 2010 from https://www.research.ibm.com/haifa/conferences/systor2009/papers/2_2_2.pdf, 13 pages.

Gene Cooperman, "Cache Basics", Jun. 27, 2003, pp. 1-2, http://web.archive.org/web/20030627070402/http://www.ccs.neu.edu/course/com3200/parentiNOTES/cache-basics.html.

Ho-Fan Kang, U.S. Appl. No. 14/303,508, filed Jun. 12, 2014 16 pages.

Ho-Fan Kang, U.S. Appl. No. 12/778,740, filed May 12, 2010 17 pages.

Ho-Fan Kang, U.S. Appl. No. 13/162,894, filed Jun. 17, 2011 27 pages.

Webopedia, "Solid State Disk", Aug. 9, 2002, pp. 1-2. https://web.archive.org/web/2002080914838/http://www.webopedia.com/TERM/S/solid_state_disk.html.

Webopedia, Garbage Collection, Dec. 20, 2009, pp. 1-3. https://web.archive.org/web/20091220052543/http://www.webopedia.com/TERM/G/garbage_collection.html.

Anand Lal Shimpi, "The SSD Relapser: Understanding and Choosing the Best SSD", Aug. 10, 2009, pp. 1-5. http://www.anandtech.com/show/2829/6.

Webopedia, "LBA", Aug. 18, 2002, pp. 1-2. https://web.archive.org/web/20020818113401/http://www.webopedia.com/TERM/L/LBA.html.

Webopedia, "Logical", Aug. 8, 2002, pp. 1-2. https://web.archive.org/web/20020808144457/http://www.webopedia.com/TERM/L/logical.html.

Webopedia, "Physical", Aug. 8, 2002, pp. 1-2. https://web.archive.org/web/20020808060150/http://www.webopedia.com/TERM/P/physical.html.

Webopedia, "Virtual", Aug. 8, 2002, pp. 1-2. https://web.archive.org/web/20020808062436/http://www.webopedia.com/TERM/V/virtual.html.

Webopedia, "NVRAM", Apr. 5, 2001, pp. 1-2. https://web.archive.org/web/20010405220736/http://www.webopedia.com/TERM/N/NVRAM.html.

Computer Hope, "Memory", Jan. 2, 2007, p. 1. https://web.archive.org/web/20070102235037/http://www.computerhope.com/jargon/m/memory;html.

* cited by examiner

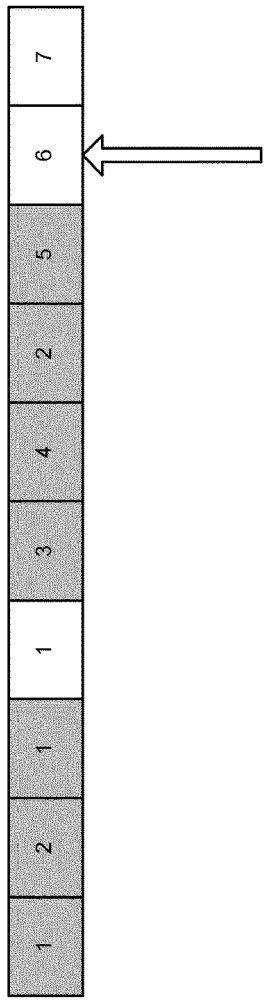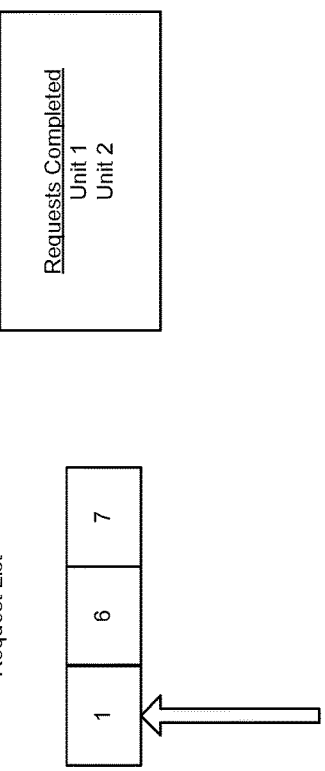
Fig. 7C
**Fig. 7D

SYSTEM AND METHOD FOR MANAGING ACCESS REQUESTS TO A MEMORY STORAGE SUBSYSTEM

CROSS-REFERENCE TO RELATED APPLICATIONS

This application is a continuation application of U.S. patent application Ser. No. 14/885,018, filed Oct. 16, 2015, which is a divisional application of U.S. patent application Ser. No. 13/166,985, filed Jun. 23, 2011, now U.S. Pat. No. 9,164,886, issued Oct. 20, 2015, entitled "System and Method for Multistage Processing in Memory Storage Subsystem," which claims priority from U.S. Provisional Application Ser. No. 61/385,132, filed on Sep. 21, 2010, the disclosures of which are incorporated herein by reference in their entirety.

BACKGROUND OF THE INVENTION

Systems for managing access to solid-state memory often perform complicated tasks such as maintaining drive coherency and mapping logical to physical addresses. In addition to receiving and processing memory access requests from host systems, these management systems often also process memory access requests related to internal maintenance operations such as garbage collection and wear leveling. The management systems may also be configured to respond to changing conditions in the physical memory media, including handling return status of memory commands executed in the media.

BRIEF DESCRIPTION OF THE DRAWINGS

Systems and methods which embody the various features of the invention will now be described with reference to the following drawings, in which:

FIGS. 7A-7D illustrate the handling media request objects by a media access request executor in accordance with an embodiment.

DETAILED DESCRIPTION

While certain embodiments of the inventions will be described, these embodiments are presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Overview

Embodiments of the invention described herein are directed to pipelined or multi-staged systems and methods for controlling and managing access to physical memory media in solid-state storage subsystems. In an embodiment, the system separates media access request management tasks such as address translation, preparation for execution at the physical memory media, and completion status reporting into discrete stages and processing components to improve performance. In an embodiment, the components in the various stages of processing media access requests cooperate with one another by using a common data structure termed a media access request object to share information on a pending request that is being processed and report any result data and/or completion status information to an entity that originated the media access request. In an embodiment, the components in the various stages of processing media access requests are executed on different processors and/or processor threads. In an embodiment, the system manages the execution timing of requests on memory units (e.g., dies) of a solid-state storage subsystem to improve concurrent use of the memory units.

Figure 1:
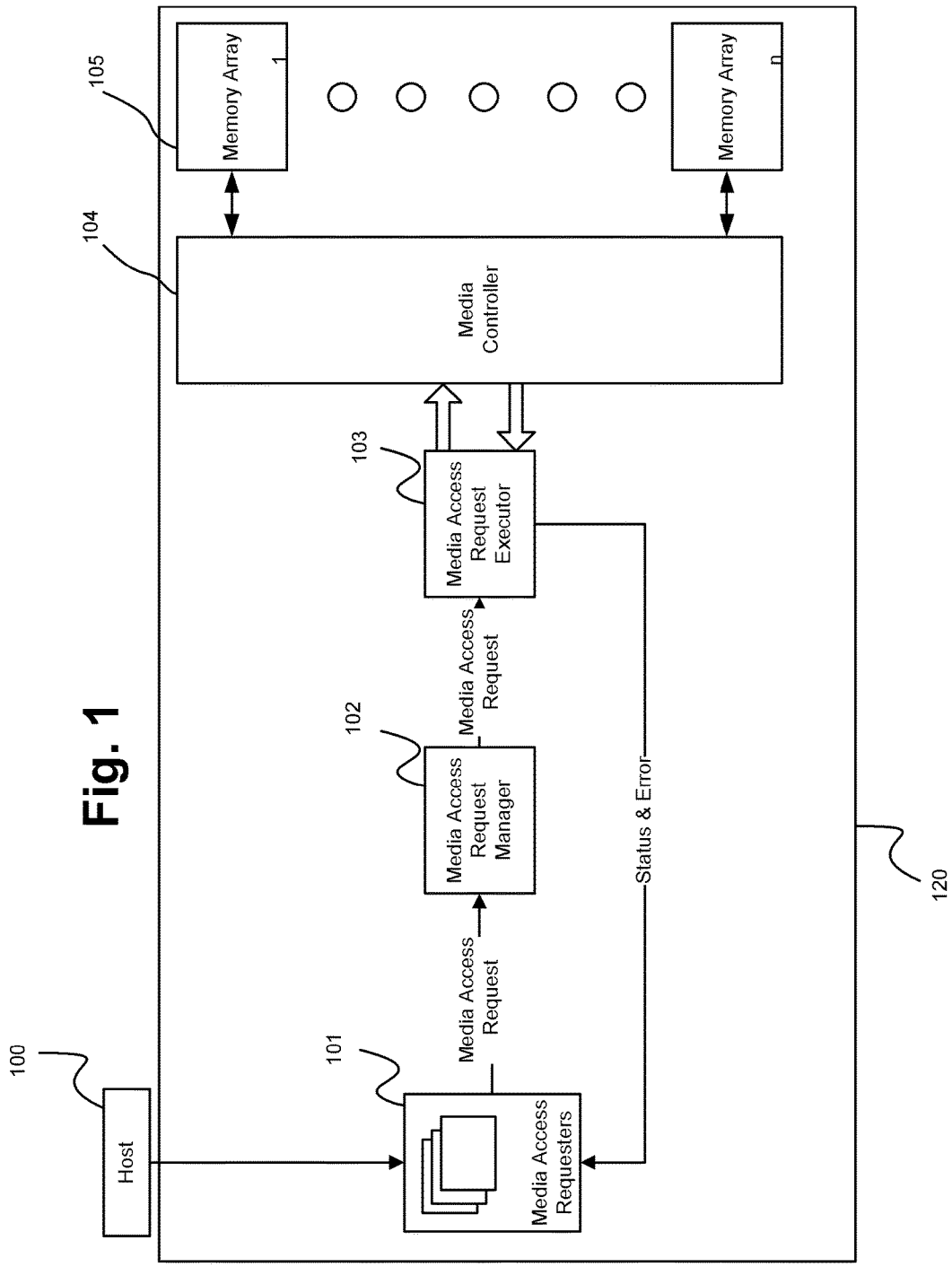
FIG. 1 illustrates an overview of an embodiment of a media access control system.

An overview of a solid state storage subsystem 120 implementing a multi-stage media access control system embodiment is presented in FIG. 1. As shown in FIG. 1, a plurality of media access requesters 101 within the storage subsystem 120 may have requests for memory access to memory arrays 105 in the storage subsystem 120. In an embodiment, a host device 100 is in communication with at least one of the media access requesters 101. The host device 100 may have requests to read or write data stored in memory arrays 105. In an embodiment, the plurality of media access requesters 101 include a media access requester responsible for handling host commands received from the host device 100, a media access requester responsible for issuing garbage collection commands, and a media access requester responsible for issuing wear leveling commands.

As shown in this embodiment, the plurality of media requesters 101 send media access requests to a media access request manager 102 in the storage subsystem 120. In an embodiment, the media access request manager 102 performs any necessary processing including address translation and ensures the media requests can be executed on the memory arrays 105. The address translation performed by the media access request manager 102 can include translation from a logical to a physical address. In an embodiment, once translation is complete, the media access request manager 102 then sends the media access requests to a media access request executor 103 in the storage subsystem 120. The media access request executor 103 is in communication with a media controller 104, and in an embodiment the media access request executor 103 determines when to send media requests to the media controller 104 for execution in the memory arrays 105. In an embodiment, since the media access requests are embedded in media access request objects, the media access request executor, as part of the sending process, may also perform any required translation of data within the media access request objects to data in a format that is understandable by the media controller 104. The media controller 104 performs media requests on the memory arrays 105 and returns a status and/or an error message to the media access request executor 103. In an embodiment, the media access request executor 103 in turn returns the status/error message of media access requests to the plurality of media access requesters 101.

Storage Subsystem Overview with Media Request Objects and Pointers

Figure 2:
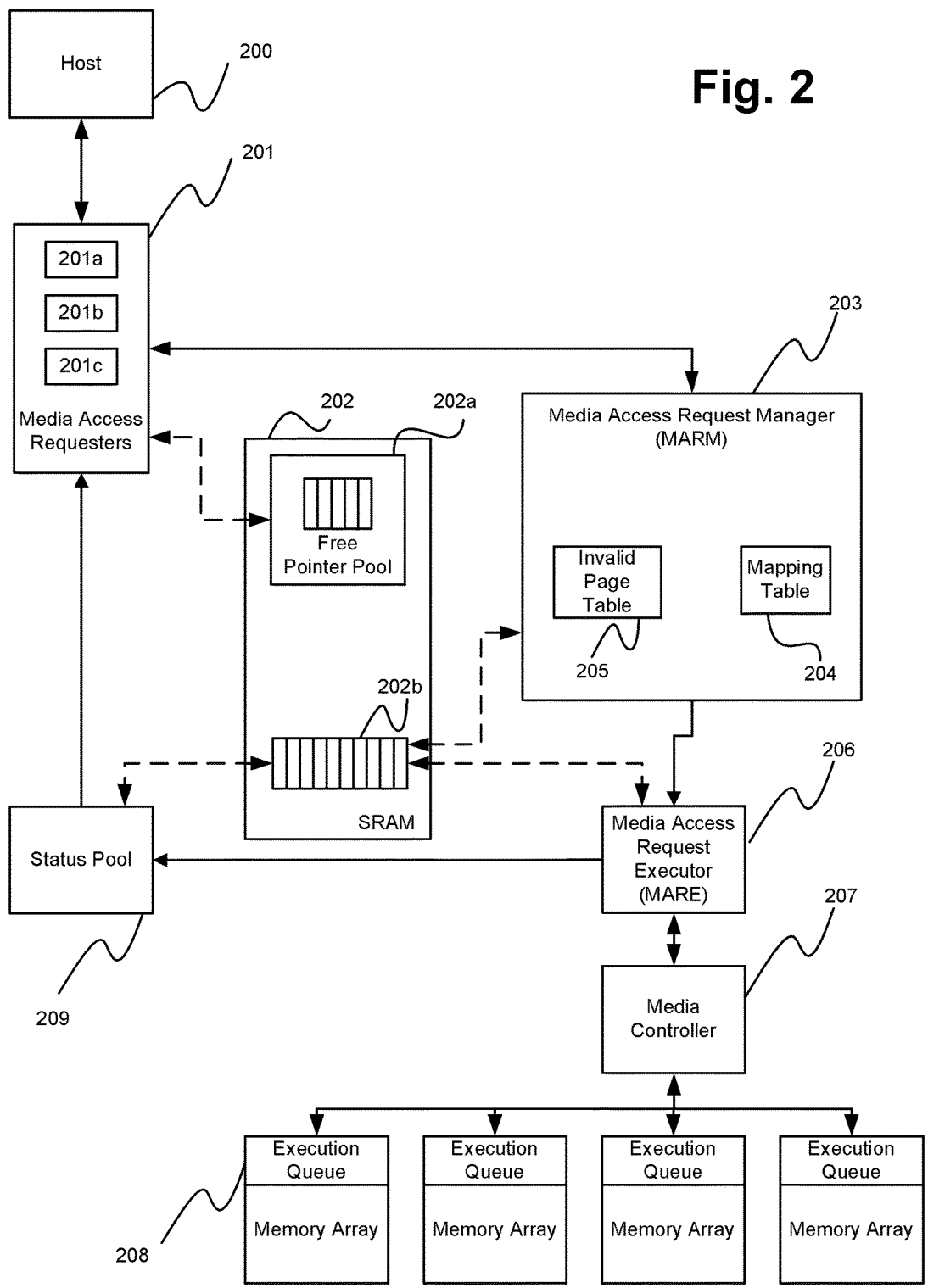
FIG. 2 illustrates a more detailed overview of an embodiment of a media access control system.

FIG. 2 provides an additional overview of the storage subsystem illustrating the use of media access request objects and pointers to process media access requests according to an embodiment. As shown in FIG. 2, a plurality of media access requesters 201 may comprise several requesters, such a host interface requester 201a, a garbage collection requester 201b, and a wear leveling requester 201c. In this embodiment, a host 200 communicates with the host interface requester 201a, but in other embodiments the host may communicate with a plurality of requesters. When the media access requesters 201 want to perform a memory access command on and interface with memory arrays 208, the media access requesters first obtain a media access request pointer to a media access request object from a free pointer pool 202a associated with a shared pointer memory 202. In this embodiment, the shared pointer memory 202 is stored in Static Random Access Memory (SRAM), though storage in other types of memory is possible in other embodiments. The media access requesters 201 may each have a dedicated portion of the shared pointer memory 202 associated with each media access requester, or the media access requesters may each request a pointer from a common pool of pointers.

In an embodiment, the shared pointer memory 202 includes a memory structure 202b with memory allocated to memory access request objects. The shared pointer memory 202 can also include a plurality of pointers to the memory access request objects. In an embodiment, each media access requester is associated with a dedicated pool of memory and may maintain its own free pointer pool.

As described below, in an embodiment, each component may access and update information in a memory access request object located in shared pointer memory 202. Each component's access is denoted by dotted lines in FIG. 2. In an embodiment, each component may be executed on a separate thread on a processor. In an embodiment, one or more components may be located on a different processor. Though in these embodiments the components are executed on different processors or separately executing threads, in some embodiments the components nonetheless all access shared pointer memory 202. Contention between processing units for access to shared pointer memory 202 is controlled by logically programming each component to access only memory associated with memory access request pointers currently being handled by that component. For example, once a media access requester 201 completes its processing of a media access request object, it passes the associated pointer to the media access request manager 203 and thus relinquishes to the media access request manager 203 any access right to that object. Likewise, when the media access request manager 203 completes processing of the same object and passes the associated pointer to the media access request executor 206, the media access request manager 203 no longer has access to the object. In summary, in various embodiments, the processing unit that has the pointer is the sole unit with access to the referenced object. Data integrity in the shared memory objects is preserved even as they are accessed by different processing units executed on different processors and/or threads, without the use of a synchronization and/or locking mechanism that may require substantial implementation costs and/or run-time system resources.

Returning to the top of FIG. 2, after obtaining a media access request pointer, the media access requester can populate the referenced media access request object with information relating to the media access request to be issued by the media access requester. For example, the media access requester may populate the media access request object with request data such as a logical address, data indicating the type of memory operation to be performed (e.g., read, write, or erase), and data associated with the operation (e.g., data to be written to a memory array for a write operation). Additional details on request data will be provided below in conjunction with the description of FIG. 4.

Once the media access request object is populated with request data, the media access requesters 201 can then pass the pointer for the media access request object to the media access request manager 203. The passing of the pointer, rather than the object itself, reduces the memory footprint necessary to implement this shared message architecture and improves system performance. In an embodiment, the media access request manager 203 maintains an invalid page table 205 and a mapping table 204. The mapping table 204 maintains a mapping between logical and physical addresses, while the invalid page table 205 maintains a list of physical addresses that contain invalid data. Typically, addresses (e.g., pages) referenced by the invalid page table can be freed through a garbage collection operation and made ready for further use. In an embodiment, the media access request manager 203 processes the incoming requests and resolves any contention between requests submitted by the plurality of media access requesters 201. For example, if the execution of a request requires an alteration to the mapping table 204 and/or invalid page table 205, the media access request manager 203 may update the tables to reflect the alteration. In certain circumstances, a media request may specify a media operation on data that has been altered since the request was first issued by the originating media access requester. In these circumstances, the media access request manager 203 may alter the request to conform to the alterations, or the media access request manager 203 may reject the request due to the conflict and return the associated media access request pointer to the originating media access requester.

In an embodiment, the media access request manager 203 may also populate the physical address field of the media access request object with a physical address that corresponds to a logical address indicated in the media access request object. For a read operation, determining a physical address that corresponds to a logical address may involve a simple lookup in the mapping table 204. For write operations, the media access request manager 203 may maintain a list of upcoming physical write locations associated with the media access requester that submitted the request. In an embodiment, the upcoming physical write locations may be associated with an open group of blocks, and the media access request manager 203 can choose a write location from the open group of blocks that is currently assigned to the requester. In an embodiment, the media access request manager 203 is configured to assign one or more open groups of blocks to individual requesters 201. In further embodiments, other ways of assigning a write location to a logical address may be implemented in any way understood to one skilled in the art.

In an embodiment, after processing the request as described above, the media access request manager 203 passes the media access request pointer to a media access request executor 206. The media access request executor 206 may be in communication with a media controller 207 to execute commands on memory arrays 208. The media access executor 206 schedules execution of requests on the memory arrays 208. In an embodiment, each memory array 208 has an associated execution queue, which stores commands issued by the media controller 207 in response to requests dispatched by the media access executor 206. In an embodiment, the media access request executor 206 maintains a record of the outstanding commands in each execution queue, and passes requests to the media controller according to the outstanding commands in each execution queue. In some embodiments, the media access request executor 206 passes the media access request pointer to the media controller 207, and the media controller 207 executes a command specified by the referenced media access request object on the memory arrays 208. In other embodiments, the media access request executor 206 translates data within the media access request object into a format executable by the media controller 207 on the memory arrays 208.

After execution of the media request on the memory arrays 208, the memory arrays 208 and/or media controller 207 in an embodiment return result data such as a status (e.g., indicating success or failure) and any other information associated with the execution to the media access request executor 206. For example, associated information for a read operation may include the data read from the memory arrays. In certain embodiments, the media access request executor 206 populates a status field in the media access request object with the returned result data and other returned information. In other embodiments, the media controller 207 populates the media request object data fields with result data.

Once result data is inserted into the media request object, in an embodiment the associated media access request pointer can then be passed from the media access request executor 206 to a request status pool/status reporter 209. In an embodiment, the media access requesters 201 will poll the request status reporter/pool 209 to retrieve any updated status for requests referenced by media access request pointers associated with that requester. In another embodiment, the request status pool/reporter can push status information to the associated requester(s).

Media Access Request Processing Cycle

Figure 3:
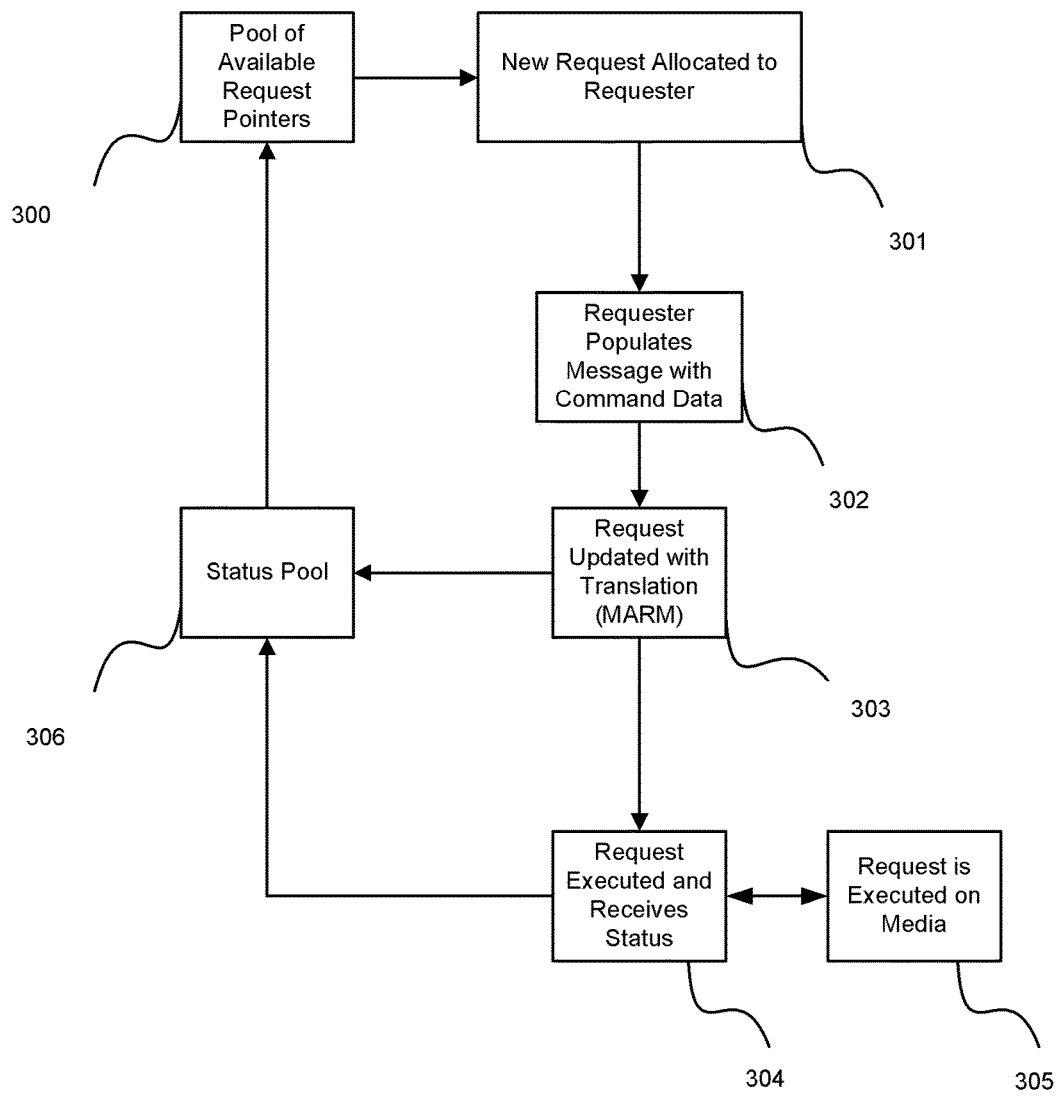
FIG. 3 is a flowchart showing the processing of a media access request object according to an embodiment.

FIG. 3 is a flowchart depicting the processing cycle of a media access request pointer/object according to an embodiment. As shown in this embodiment, at block 300, a media access request pointer is maintained in a pool of available request pointers. When a media access request is needed by a media access requester, a media access request pointer can be allocated to the requester at block 301. Next, as shown at block 302, the media access requester can populate the media access request object referenced by the allocated pointer with command data, such as the command type, the logical address associated with the command, and any other associated data (such as write data for a write command). The media access request pointer is then passed to the media access request manager at block 303, where the media access request data may be updated for translation. If the media access request is determined to have a conflict with other pending requests or otherwise cannot be completed according to the data populated in the referenced media access request object, the media access request may be updated with a status indicating it was not executed and the media access request pointer may be passed to a status pool 306. After updating the media access request object with a physical address location by translation of the logical address, the media access request manager can pass the media access request pointer to the media access request executor at block 304. The media access request is then executed on the media at block 305 and the request will be updated with a result and status. As described above, the media access request pointer may or may not require translation for a media controller for execution at block 305. After execution, the media access request pointer is passed to the status pool 306. As described above, the status pool 306 holds media access request pointers until they are reviewed by the media access requesters. Once reviewed, the media access requester will then free the pointers by placing them back into the pool of available request pointers, where they can be allocated to the next requesters.

Media Access Request Object Structure

Figure 4:
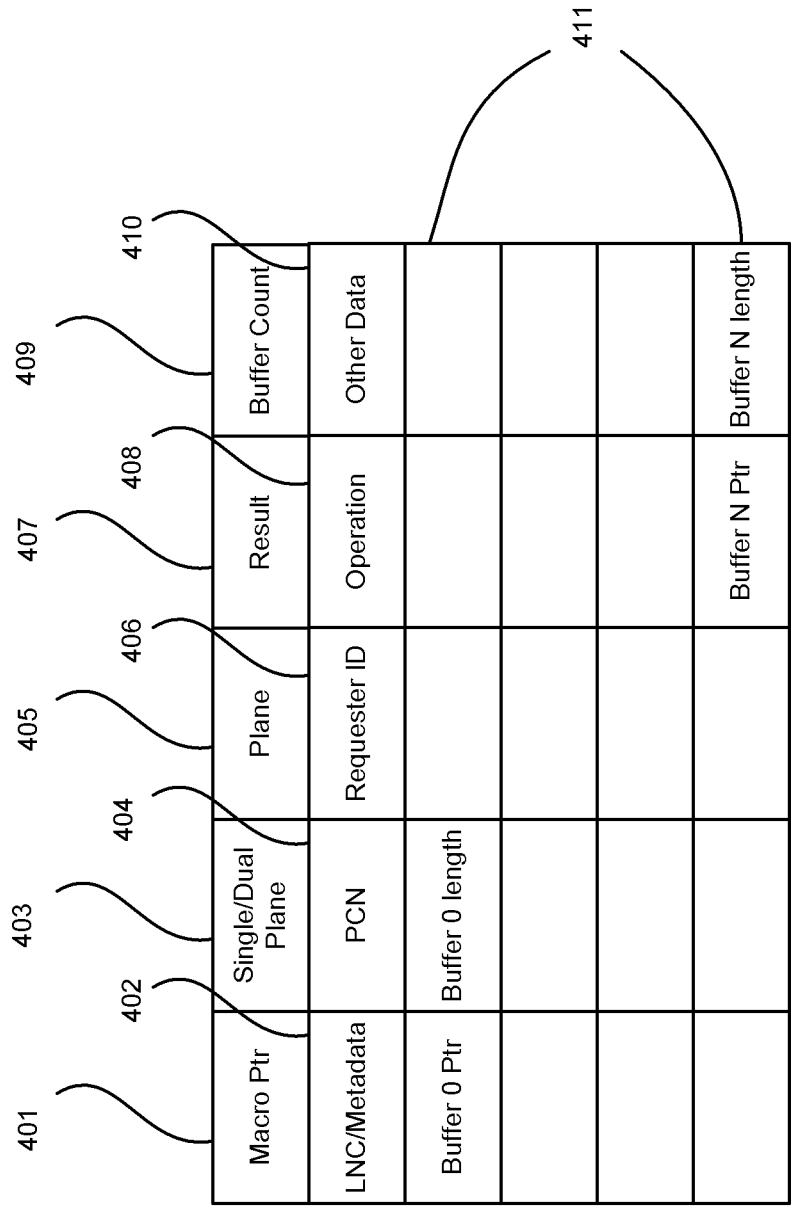
FIG. 4 illustrates a structure of an embodiment for a media access request object.

FIG. 4 depicts data fields allocated for the media access request object according to an embodiment. As shown in the embodiment in FIG. 4, the media access request object includes a variety of data fields to hold information about the request. The media access request object embodiment shown in FIG. 4 includes data fields for a macro pointer 401, a single/dual plane designation 403, plane selection 405 indicating which plane on a die is being accessed, operation data 408 indicating the associated memory operation type, a logical chunk number 402, a physical chunk number 404, a requester ID 406, a result status 407, and a count 409 for the number of buffers in the request. The media access request object may also contain a field for other data 410. In certain embodiments, the logical chunk number data field 402 may also be used for metadata about the request. Certain embodiments of the media access request object may include data for specifying single or dual plane operations which can be designated by the single/dual plane designation 403. The media access request object may also include buffers 411 to store read and write data relating to the request.

As the media access request object is passed among the components of the media request control system within the storage subsystem, various portions of the media access request object are populated. For example, the media access requester may populate fields such as the requester ID data field 406 (indicating the originating requester), the operation data field 408, and the logical chunk number data field 402. For a write request, the media access requester may populate data to be written into buffers 411. In an embodiment, when the media access request object is passed to the media access request manager, the physical chunk number field 404, and the plane field 405 are populated. In an embodiment, if the request cannot be executed, the media access request manager can update the result data field 407. After the execution of the media request in the physical memory media, the media access executor and/or the media controller can update the result data field 408, and for some operations, e.g., a read operation, the buffers 411 with data read from the target physical address.

Media Access Request Manager

Figure 5:
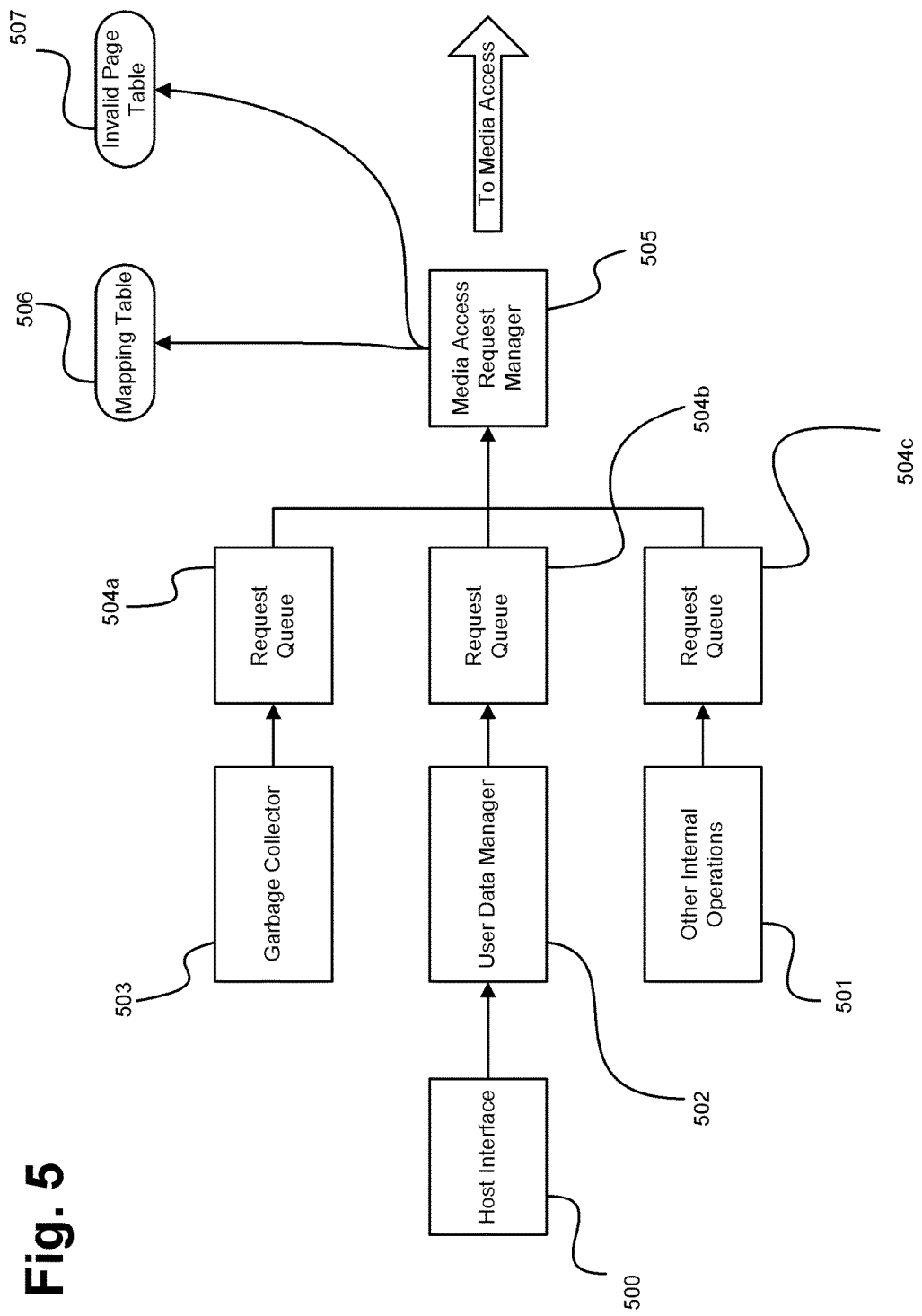
FIG. 5 illustrates a detailed overview of an embodiment for a media access request manager.

A detailed view of an embodiment of the media access request manager is shown in FIG. 5. In this embodiment, three media access requesters are shown, a garbage collector 503, a user data manager 502, and a requester for other internal operations 501. Other internal operations 501 may include, for example, wear leveling operations. The user data manager 502 is in communication with a host interface 500 and is responsible for responding to host communications (e.g., accepting incoming memory commands from the host). In this embodiment, each requester may have a dedicated request queue 504*a-c*. In other embodiments, certain requesters may share one or more request queues 504. For example, the user data manager 502 and other internal operations 501 may share a single request queue. Each media access requester may obtain a media access request pointer and populate the media access request object as described above. In an embodiment, the media access requester can then place the media access request pointer in the associated request queue.

In an embodiment, the media access request manager 505 receives media access request pointers from the request queues 504a-c. After receiving the media access request pointers, the media access request manager 505 in an embodiment updates the media access request object with reference to a mapping table 506 and an invalid page table 507. In an embodiment, the media access request manager 505 maintains a designated write location for each requester or request queue. In an embodiment, the media access request manager 505 determines a physical address for the write location corresponding to an open block in a group of blocks for each requester or request queue. In an embodiment, after receiving a write command request at the media access request manager 505, the mapping table 506 is updated with the new physical address corresponding to the logical address of the request. The invalid page table 507 is then updated to indicate that the physical address formerly mapped to the logical address is invalid. In an embodiment, the media access request manager 505 also updates an invalid page counter for the block or group of blocks corresponding to the old physical address. In an embodiment, the media access request manager 505 is the only entity with access rights to write to the mapping table 506 and the invalid page table 507. Restricting write accesses to the media access request manager 505 ensures a single point of control for these tables, and prevents possible contentions and data coherency errors that may result if the requesters were granted direct access to the tables.

In an embodiment, when the media access request manager 505 receives media access request pointers from the request queues 504a-c, the media access request manager 505 may determine a ratio at which to process media access request pointers from each queue. While requests from each requester must generally be executed in-order relative to other requests from that requester, requests from each requester may generally be executed in a different order than received relative to requests from another requester. For example, if a read command from the user data manager 502 is directed to the same logical address as a garbage collection command from the garbage collector 503, the media access request manager 505 can ensure that the physical address of each command is updated to appropriately compensate for the order of execution. If the garbage collection command is processed first, the read command can be directed to the new physical address corresponding to the same logical address. If the read command is processed first, the read command is executed prior to any data movement associated with the garbage collection command and revisions to the physical addresses of the data. As such, the media access request manager ensures coherency with the mapping and invalid page tables, thereby preventing downstream request execution conflicts.

In an embodiment, the option of processing requests from the queues in different ratios allows the media access request manager 505 to throttle, or provide dynamic ratios, of requests received from each request queue 504 and thereby prioritize a specific requester over other requesters. For example, the media access request manager 505 can receive and process two or three or more requests from the user data manager 502 for every request from garbage collector 503 (or vice versa). In an embodiment, the media access request manager 505 temporarily halts receiving media access request pointers from a request queue when certain conditions are met. For example, if the invalid page table shows a high need for garbage collection, the requests for user data manager 502 may be throttled down or halted to allow for more garbage collection requests to be processed. Alternatively, if the user data manager 502 has an unusually high number of requests, or if the request queue 504a for the user data manager 502 is nearing a threshold, the requests associated with the garbage collector 503 may be throttled down or halted. After preparing the media access request for execution, the media access request manager 505 passes the media access request pointer to the media access request executor.

Media Access Request Executor

Figure 6:
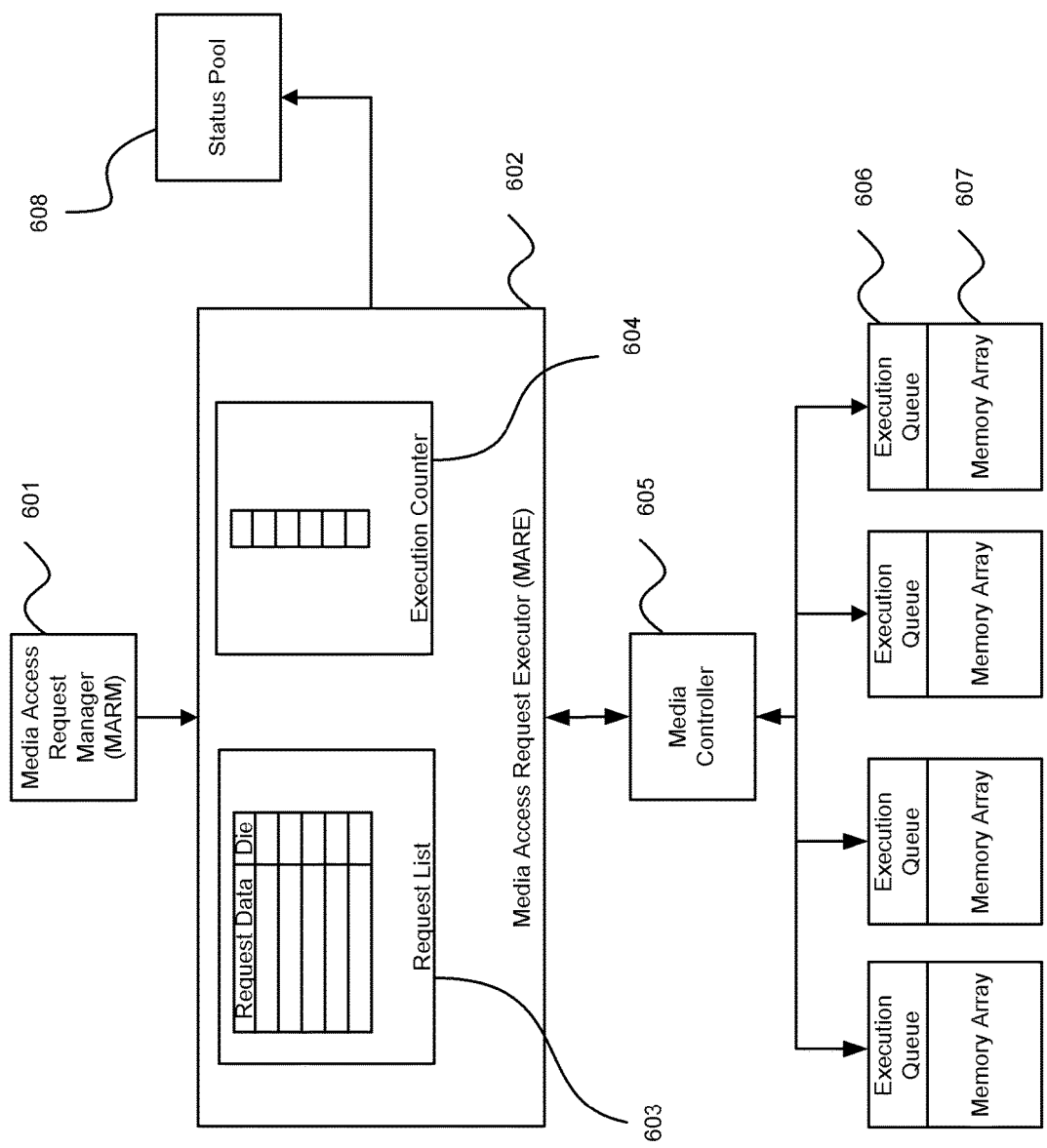
FIG. 6 illustrates a detailed overview of an embodiment for a media access request executor.

FIG. 6 depicts a media access request executor according to an embodiment. In an embodiment, the media access request executor 602 receives media access request pointers from a media access request manager 601. The media access request executor improves throughput and concurrency on memory arrays 607 by determining when to pass media access requests down to a media controller 605 for execution. In an embodiment, the media access request executor 602 maintains a request list 603 and execution counters 604. In this embodiment, received media access requests from the media access request manager 601 are placed on the request list 603. In certain embodiments, the request list identifies a specific memory unit associated with the media access request. The memory unit associated with a media access request may be a die of solid-state memory. In other embodiments, the request list identifies another granularity of the memory arrays 607 (e.g., plane(s) or block(s) with a die or a device including multiple dies), which is generally the lowest level of memory access on which the memory array can accept commands while other commands can be executed on a portion of the memory array addressed at the same level. In this embodiment, the execution counters 604 maintain a record of the pending requests associated with each memory unit. As requests are directed to each memory unit and requests are completed at each memory unit, the execution counter of each memory unit increments and decrements accordingly.

In an embodiment, when the media access request executor 602 has determined that a media access request should be executed, the media access request executor 602 will pass the media access request to media controller 605. As described above, in certain embodiments the media access request executor 602 can pass a media access request pointer to media controller 605, while in other embodiments the media access request executor 602 performs a translation to a format acceptable to the media controller 605. Media controller 605 directs each media access request to an execution queue 606 associated with each memory arrays 607. Each memory array 607 may be accessed via an associated data channel. The execution queue 606 for each memory array 607 may be maintained on the memory arrays 607, or may be maintained as a part of media controller 605. As media access requests are completed on memory arrays 607, the media controller 605 will return a status and any associated information to the media access request executor 602. As necessary, the media access request executor 602 incorporates the status and associated information into the media access request object and passes the media access request pointer to status pool 608. In an embodiment, the media controller 605 populates the status and associated information fields of the media access request object instead of the media access request executor 602. As described above, the media access requesters receive media access request pointers from the status pool 608.

Figure 7A:
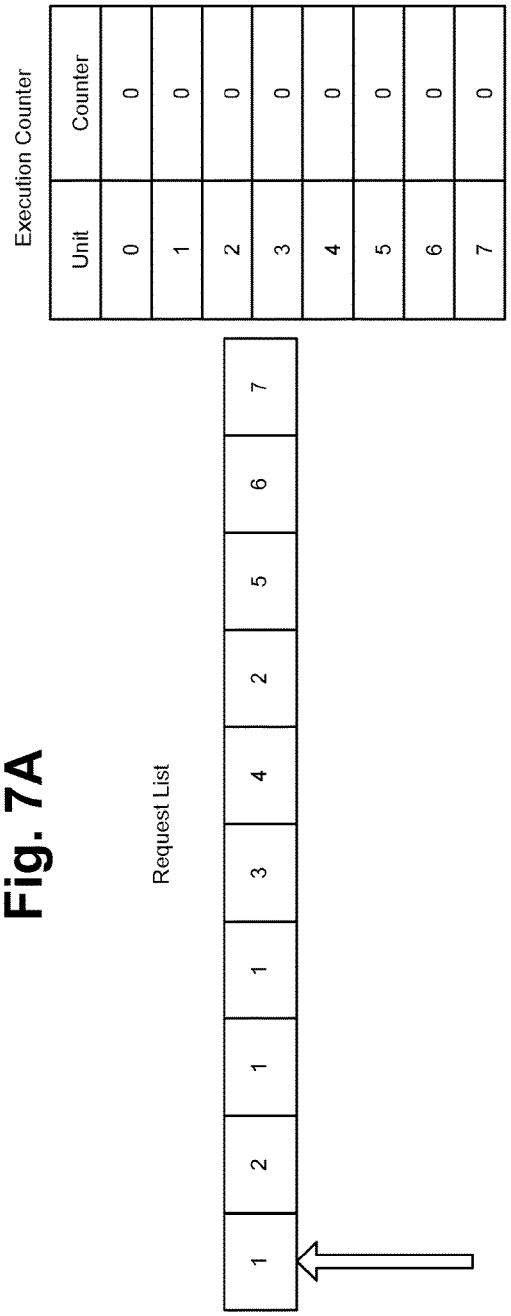
Figure 7B:
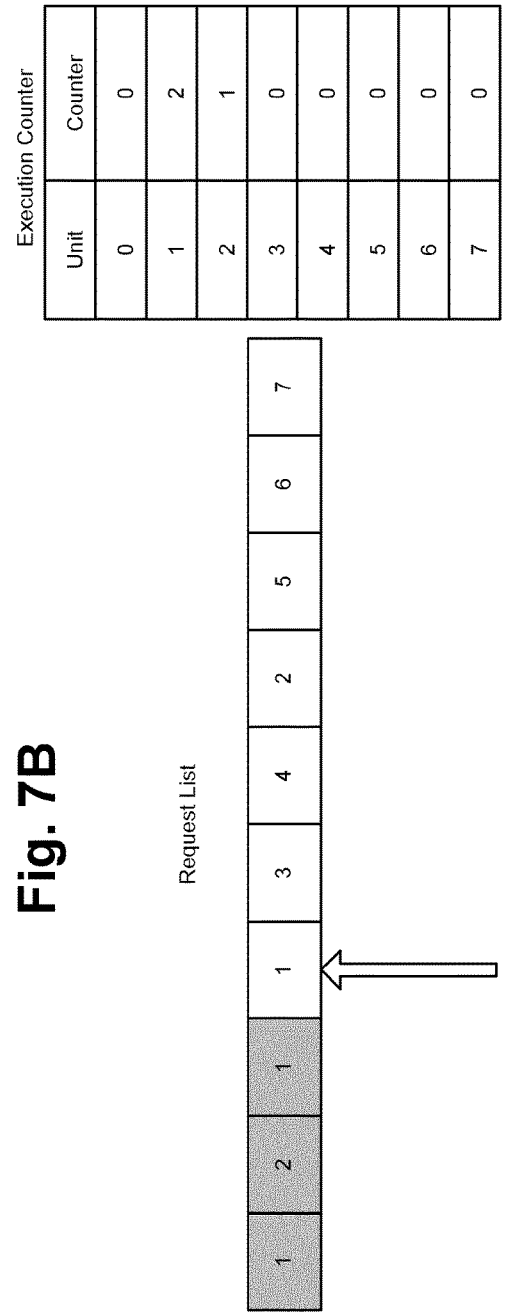

One example method of determining when to execute media access requests is shown in FIGS. 7A-7D. As shown in FIG. 7A, in an embodiment the request list includes a reference to the memory unit associated with each memory access request (each box represents a memory access request and the number within is the reference). In this example, starting with FIG. 7A, the execution counters show that all of the memory units (0-7) do not have any pending media access requests. In an embodiment, the media access request executor also maintains a current position on the request list, which is shown in this example by the arrow pointing to the first request directed at memory unit 1. As the media access request executor sends requests to the media controller for execution, the media access request executor updates the execution counter corresponding to the memory unit associated with the media access request. FIG. 7B shows the status of the request list and execution counters after the first three requests have been processed (now shaded in grey) and sent to the media controller for execution. As shown, two requests for memory unit 1 and one request for memory unit 2 have been sent to the media controller for execution. Accordingly, the media execution counters have been updated, and the request list indicates that these requests have been sent. The current position on the request list as shown is from a time immediately after the last-sent request.

In various embodiments, each memory unit is capable of having a certain threshold number of outstanding requests at once. As such, the media access request executor cannot send additional requests past this outstanding request threshold. The outstanding request threshold is typically dictated by the depth of the execution queue 606 depicted in FIG. 6. In the example shown in FIGS. 7A-7D, for ease of explanation, the threshold number of outstanding requests is two. In actual systems, the number of possible outstanding requests may be higher. In an embodiment, when the current position in the request list points to a request directed to a memory unit for which the outstanding request threshold has been reached, the media access request executor skips that request on the request list and continues to process the next requests on the list. As shown in FIG. 7C, a media access request directed to memory unit 1 has been skipped because that memory unit had already reached the threshold number of outstanding requests (as indicated by the counter). After the skip, the media access request executor has gone on to process requests directed to memory units 3, 4, 2, and 5, and the associated media execution counters have been incremented.

In an embodiment, as the request list is traversed, the current position in the request list will reach a reset point and return to the first skipped request to determine if that request can now be executed. The reset point can be determined in a variety of ways. The current position can return to the first skipped request upon the triggering of a condition. As examples, the condition can be based at least partially on any of: the number of requests that have been skipped (in total or for a particular memory unit), receiving an indication notifying of a request completion from a memory unit that has been skipped, and reaching the end of the request list. In various embodiments, as the request list is continually changing to reflect processed requests and new incoming requests from the media access request manager, periodic snapshots of the request list are taken and the aforementioned condition for reset may also be based on reaching the end of a snapshot of the request list. FIG. 7D shows an embodiment of the request list and execution counters if a reset point has been reached immediately after the system state in FIG. 7C. When the reset point is reached, the media controller is polled to determine if any requests have been completed, since these completed requests can result in the media access request executor decrementing the execution counters. In FIG. 7D, requests corresponding to memory units 1 and 2 have completed and the corresponding execution counters are decremented. The current position in the request list now returns to the first skipped request, which here corresponds to memory unit 1. Returning to the first skipped request ensures that memory requests for a particular memory unit are executed in-order relative to that memory unit. Because certain requests are skipped, the requests for a memory unit may be executed out-of-order with respect to the time when the requests for other memory units were received. However, because these requests correspond to different, independently accessible memory units, data coherency is maintained. In the embodiment shown in FIG. 7D, at the reset point the media access request executor also clears the request list of requests that have already been sent to the media controller and/or added to the appropriate execution queues for the respective memory units. Other embodiments may remove a request from the request list only when the request is completed on the memory unit. Completed requests may be passed to a status pool as described above.

In alternate embodiments, other methods for maintaining a list of requests to be executed may be used. For example, at the media access request executor level, the received requests may be placed in individual queues associated with each memory unit. The media access request executor may then send media access requests from the queues to the media controller by checking whether the associated media unit has reached a threshold in the media execution counter. In an embodiment, the media access request executor may check only those queues which have not reached the threshold in the execution counter. In an embodiment, the media access request executor checks the queues associated with each memory unit by a round robin algorithm. A flag can be used to designate which memory units have an execution counter that has reached the threshold. According to another embodiment, the media access request executor reorders the media access requests in the request list at least partly based on the status of the associated memory units. The status of the associated memory units may be determined with reference to the execution counters. Other data management means can be used to control the flow of media requests to the media controller in accordance with this disclosure.

By temporarily skipping certain requests, the media access request executor increases the concurrent use of the memory units (by sending requests to those units before other units have finished requests). Further, by using a reset point, the media access request executor can return to process skipped requests to preserve data coherency.

CONCLUSION

The features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:
1. A storage subsystem, comprising:
a media access request manager;
a plurality of media access requesters in electrical contact with the media access request manager; and a non-volatile solid-state memory array, the non-volatile solid-state memory array including a plurality of memory units in electrical contact with the media access request manager;
wherein the media access request manager is configured to:
receive a plurality of media access request pointers from a plurality of request queues, wherein each request queue is associated with a different one of the plurality of media access requesters; and
determine a dynamic ratio at which to process the plurality of media access request pointers from each of the plurality of request queues, wherein each media access request pointer is associated with a specific media request object and wherein only one media access requester may have access to the specific media request object at a time; and
wherein the plurality of media access requestors obtains the plurality of media access request pointers from a free pointer pool.

2. The storage subsystem of claim 1, wherein the plurality of media access requestors comprises: a user data manager, a garbage collector and a requestor for wear leveling operations.

3. The storage subsystem of claim 1, wherein the media access request manager is configured to:
receive a write command request;
update a mapping table with a new physical address corresponding to a logical address of the write command request; and
update an invalid page table to indicate that a physical address formerly mapped to the logical address of the write command request is invalid.

4. The storage subsystem of claim 1, wherein the plurality of media access request pointers are processed in a different order than they were received.

5. The storage subsystem of claim 1, wherein the media access request manager is configured to prioritize requests from a first media access requestor over requests from a second media access requestor.

6. The storage subsystem of claim 1, wherein the media access request manager is configured to temporarily halt receiving media access request pointers from a particular media access requestor when a condition has been reached.

7. A method of managing access requests to a non-volatile solid state memory array from a plurality of media access requestors in a storage subsystem, the method comprising:
obtaining, by plurality of media access requests, a plurality of media access request pointers from a free pointer pool;
receiving, by a media access request manager, the plurality of media access request pointers from a plurality of request queues, wherein each request queue is associated with a different one of the plurality of media access requestors;
determining, by the media access request manager, a ratio at which to process the plurality of media access request pointers from each of the plurality of request queues, wherein each media access request pointer is associated with a specific media request object and wherein only one media access requestor may have access to the specific media request object at a time; and changing, by the media access request manager, the ratio at which to process the plurality of media access request pointers from each of the plurality of request queues.

8. The method of claim 7, wherein the plurality of media access requestors comprises: a user data manager, a garbage collector and a requestor for wear leveling operations.

9. The method of claim 7, comprising:
receiving, by the media access request manager, a write command request;
updating, by the media access request manager, a mapping table with a new physical address corresponding to a logical address of the write command request; and
updating, by the media access request manager, an invalid page table to indicate that a physical address formerly mapped to the logical address of the write command request is invalid.

10. The method of claim 7, comprising:
processing, by the media access request manager, the plurality of media access request pointers in a different order than they were received by the media access request manager.

11. The method of claim 7, comprising:
prioritizing, by the media access request manager, requests from a first media access requestor over requests from a second media access requestor.

12. The method of claim 7, comprising:
temporarily halting, by the media access request manager, receiving media access request pointers from a particular media access requestor when a condition has been reached.

13. A storage subsystem, comprising:
a media access request manager means;
a plurality of media access requestor means in electrical contact with the media access request manager means, the plurality of media access requestor means operable to obtain a plurality of media access request pointers from a free pointer pool;
a non-volatile solid-state memory array, the non-volatile solid-state memory array including a plurality of memory units in electrical contact with the media access request manager means; and
wherein the media access request manager means is operable to:
receive the plurality of media access request pointers from a plurality of request queues, wherein each request queue is associated with a different one of the plurality of media access requestor means;
determine a ratio at which to process the plurality of media access request pointers from each of the plurality of request queues, wherein each media access request pointer is associated with a specific media request object and wherein only one of the plurality of media access requestor means may have access to the specific media request object at a time throttle processing of the plurality of media access pointers from one of the plurality of request queues.

14. The storage subsystem of claim 13, wherein the plurality of media access means comprises: a user data manager, a garbage collector and a requestor for wear leveling operations.

* * * * *